US010658926B2

(12) United States Patent
DeReus et al.

(10) Patent No.: US 10,658,926 B2
(45) Date of Patent: May 19, 2020

(54) CHARGE PUMP SYSTEMS, DEVICES, AND METHODS

(71) Applicant: wiSpry, Inc., Irvine, CA (US)

(72) Inventors: Dana DeReus, Santa Ana, CA (US); Arthur S. Morris, III, Lakewood, CO (US); David Zimlich, Dana Point, CA (US); Vincent Cheung, San Gabriel, CA (US)

(73) Assignee: WISPRY, INC., Irvine, CA (US)

( * ) Notice: Subject to any disclaimer, the term of this patent is extended or adjusted under 35 U.S.C. 154(b) by 0 days.

(21) Appl. No.: 16/287,857

(22) Filed: Feb. 27, 2019

(65) Prior Publication Data

US 2019/0267894 A1 Aug. 29, 2019

Related U.S. Application Data

(60) Division of application No. 15/940,458, filed on Mar. 29, 2018, which is a continuation of application No. PCT/US2018/000069, filed on Feb. 16, 2018.

(60) Provisional application No. 62/460,003, filed on Feb. 16, 2017.

(51) Int. Cl.
*H02M 3/07* (2006.01)
*B81B 7/04* (2006.01)
*G05F 3/20* (2006.01)
*B81B 5/00* (2006.01)
(Continued)

(52) U.S. Cl.
CPC ................ *H02M 3/07* (2013.01); *B81B 5/00* (2013.01); *B81B 7/008* (2013.01); *B81B 7/04* (2013.01); *G05F 3/205* (2013.01); *B81B 2203/04* (2013.01); *B81B 2207/053* (2013.01); *H02M 2001/0003* (2013.01)

(58) Field of Classification Search
CPC .......... H02M 3/07; H02M 2001/0003; H02M 3/073; H02M 2003/077; B81B 7/008; B81B 5/00; B81B 7/04; B81B 2207/053; B81B 2203/04; G05F 3/205; G05F 3/24
See application file for complete search history.

(56) References Cited

U.S. PATENT DOCUMENTS

| RE35,121 E | 12/1995 | Olivo et al. |
| 5,635,776 A | 6/1997 | Imi |
| 5,729,163 A | 3/1998 | McCleary et al. |

(Continued)

FOREIGN PATENT DOCUMENTS

| KR | 101464257 B1 | 11/2014 |
| WO | WO 2012095897 A1 | 7/2012 |

(Continued)

OTHER PUBLICATIONS

Final Office Action for U.S. Appl. No. 15/940,458, dated May 3, 2019.

(Continued)

*Primary Examiner* — Jung Kim
(74) *Attorney, Agent, or Firm* — Jenkins, Wilson, Taylor & Hunt, P.A.

(57) ABSTRACT

The present subject matter relates to charge pump devices, systems, and methods in which a plurality of series-connected charge-pump stages are connected between a supply voltage node and a primary circuit node, and a discharge circuit is connected to the plurality of charge-pump stages, wherein the discharge circuit is configured to selectively remove charge from the primary circuit node.

12 Claims, 6 Drawing Sheets

(51) Int. Cl.
*B81B 7/00* (2006.01)
*H02M 1/00* (2006.01)

(56) References Cited

U.S. PATENT DOCUMENTS

| | | |
|---|---|---|
| 5,943,226 A | 8/1999 | Kim |
| 6,037,622 A | 3/2000 | Lin et al. |
| 6,107,864 A | 8/2000 | Fukushima et al. |
| 6,130,572 A | 10/2000 | Ghilardelli et al. |
| 6,278,315 B1 | 8/2001 | Kim |
| 6,359,501 B2 | 3/2002 | Lin et al. |
| 6,418,040 B1 | 7/2002 | Meng |
| 6,434,028 B1 | 8/2002 | Takeuchi et al. |
| 6,501,325 B1 | 12/2002 | Meng |
| 6,734,717 B2 | 5/2004 | Min |
| 7,023,260 B2 | 4/2006 | Thorp et al. |
| 7,777,557 B2 | 8/2010 | Yamahira |
| 7,808,303 B2 | 10/2010 | Yamahira |
| 8,120,413 B2 | 2/2012 | Li et al. |
| 9,047,782 B1 | 6/2015 | Lee |
| 9,431,201 B2 | 8/2016 | Nguyen et al. |
| 10,530,247 B2 | 1/2020 | Morris et al. |
| 2007/0096796 A1 | 5/2007 | Firmansyah et al. |
| 2008/0169864 A1 | 7/2008 | Yamahira |
| 2010/0237929 A1 | 9/2010 | Ikehashi |
| 2013/0187707 A1 | 7/2013 | Tran et al. |
| 2013/0321069 A1 | 12/2013 | Yajima et al. |
| 2015/0316586 A1 | 11/2015 | Hammerschmidt et al. |
| 2015/0381036 A1 | 12/2015 | Watanabe et al. |
| 2016/0285363 A1 | 9/2016 | Englekirk |
| 2016/0381455 A1 | 12/2016 | Zeleznik et al. |
| 2018/0314284 A1 | 11/2018 | Morris et al. |
| 2018/0337595 A1 | 11/2018 | Morris et al. |

FOREIGN PATENT DOCUMENTS

| | | |
|---|---|---|
| WO | WO 2018/151853 A1 | 8/2018 |
| WO | WO 2018/151854 A1 | 8/2018 |

OTHER PUBLICATIONS

Interview Summary for U.S. Appl. No. 15/940,458 dated Jun. 7, 2019.
Notice of Allowance for U.S. Appl. No. 15/983,123 dated Jun. 19, 2019.
International Search Report and Written Opinion for Application No. PCT/US2018/000069 dated Jun. 12, 2018.
International Search Report and Written Opinion for Application No. PCT/US2018/000070 dated Jun. 25, 2018.
Restriction Requirement for U.S. Appl. No. 15/940,458 dated Aug. 27, 2018.
Non-Final Office Action for U.S. Appl. No. 15/940,458 dated Jan. 30, 2019.
Interview Summary for U.S. Appl. No. 15/940,458 dated Apr. 8, 2019.
Notice of Allowance for U.S. Appl. No. 15/940,458 dated Nov. 19, 2019.
Ex Parte Quayle Action for U.S. Appl. No. 15/940,458 dated Aug. 29, 2019.

CHARGE PUMP SYSTEMS, DEVICES, AND METHODS

PRIORITY CLAIM

This application is a divisional patent application of and claims priority to co-pending U.S. patent application Ser. No. 15/940,458, filed Mar. 29, 2018, which is a continuation of and claims priority to PCT Application No. PCT/US2018/00069, filed Feb. 16, 2018, which claims priority to U.S. Provisional Patent Application Ser. No. 62/460,003, filed Feb. 16, 2017, the disclosures of which are incorporated herein by reference in their entireties.

TECHNICAL FIELD

The subject matter disclosed herein relates generally to charge pumps. More particularly, the subject matter disclosed herein relates to configurations and operation of charge pumps used to charge a capacitor to a relatively higher potential than a voltage supply.

BACKGROUND

Charge pumps are used to generate a desired high voltage output in configurations where the supply voltage is comparatively low. Even where such a high-voltage output would be advantageous, however, various issues associated with charge pumps have prevented them from replacing other high voltage sources. For example, parasitics to ground, space required for charge pump elements (e.g., pump stages, control circuits, hold capacitor), and time to charge can all be seen as detrimental to certain circuits. For many of these reasons, the applicability of charge pumps has been limited despite the ability to generate a high voltage output from a comparatively low supply voltage.

SUMMARY

In accordance with this disclosure, charge pump devices, systems, and methods are provided. In one aspect, a charge pump is provided in which a plurality of series-connected charge-pump stages are connected between a supply voltage node and a primary circuit node, and a discharge circuit is connected to the plurality of charge-pump stages, wherein the discharge circuit is configured to selectively remove charge from the primary circuit node.

In another aspect, a method for regulating charge at a primary circuit node includes selectively driving charge between stages of a plurality of series-connected charge-pump stages connected between a supply voltage node and a primary circuit node, and selectively removing charge from the primary circuit node though a discharge circuit connected to the plurality of charge-pump stages.

In another aspect, a micro-electro-mechanical systems (MEMS) device according to the present subject matter includes at least one fixed electrode; a movable beam including at least one movable electrode that is spaced apart from the at least one fixed electrode and is movable with respect to the at least one fixed electrode; a plurality of series-connected charge-pump stages connected between a supply voltage node and a primary circuit node, wherein the primary circuit node is connected to one of the at least one movable electrode or the at least one fixed electrode; and a discharge circuit connected to the plurality of charge-pump stages, wherein the discharge circuit is configured to selectively remove charge from the primary circuit node.

Although some of the aspects of the subject matter disclosed herein have been stated hereinabove, and which are achieved in whole or in part by the presently disclosed subject matter, other aspects will become evident as the description proceeds when taken in connection with the accompanying drawings as best described hereinbelow.

BRIEF DESCRIPTION OF THE DRAWINGS

The features and advantages of the present subject matter will be more readily understood from the following detailed description which should be read in conjunction with the accompanying drawings that are given merely by way of explanatory and non-limiting example, and in which.

DETAILED DESCRIPTION

The present subject matter provides charge pump devices, systems, and methods. In one aspect, the present subject matter provides a charge pump that both charges a capacitor or other element in communication with a primary circuit node to a relatively higher potential than a voltage supply and pumps down the high-voltage charge without any form of high-voltage switches. Referring to one example configuration illustrated in FIG. 1, a charge pump, generally designated 100, can include a plurality of series-connected charge-pump stages 105-1 through 105-n connected between a supply voltage node 101 and a primary circuit node 102 (i.e., with the voltage output of one pump stage being the voltage input to the subsequent pump stage).

Figure 1:
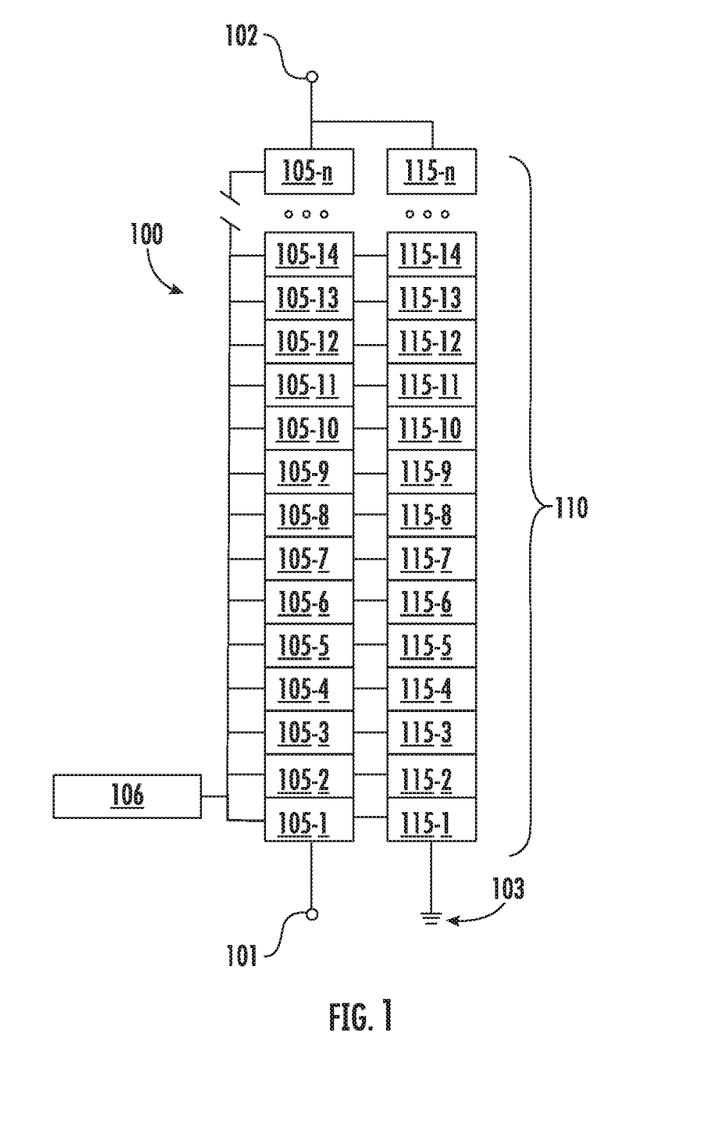
FIG. 1 is a schematic diagram of a charge pump according to an embodiment of the presently disclosed subject matter.

In some embodiments, for example, charge pump 100 can be a Dickson-type charge pump, where charge-pump stages 105-1 through 105-n include multiple stages of capacitors linked by a diode string. As used herein, the term 'diode' is not intended to be limited to semiconductor diodes but instead is used generally to refer to any two-terminal electronic component that conducts current primarily in one direction (i.e., bias-dependent), including MOSFET circuits that emulate a diode. In such an arrangement, charge is passed between the capacitors through the diode string by a two-phase clock (e.g., supplied by a clock driver circuit 106) such that it can only flow one way, and the charge builds up at the end of the string at primary circuit node 102. The number of stages can be selected to generate the amount of voltage step-up desired from charge pump 100. For instance, the number of stages can be selected based on the difference between the desired high voltage output at primary circuit node 102 and the charge pump's voltage supply at supply voltage node 101. The number of stages is thereby generally fixed for any given application.

For example, one configuration for a charge pump design can include an even number of stages, half of which are clocked high on each rising clock edge and the other half are clocked high on the falling clock edge. In some embodiments, charge-pump stages 105-1 through 105-n include a plurality of diodes connected in a series arrangement between supply voltage node 101 and primary circuit node 102. To drive charge across the diode chain, charge-pump stages 105-1 through 105-n further include a plurality of pump stage capacitors that are each connected to a cathode terminal of a corresponding one of the associated diodes to form each charge pump stage, and clock driver circuit 106 controls the charging of the pump stage capacitors. Although one example of a configuration of charge pump 100 is discussed here, those having ordinary skill in the art will recognize that charge pump 100 can be provided in any of a variety of other configurations in which charge is driven between stages of the plurality of charge-pump stages 105-1 through 105-n.

In addition to this structure that is similar to conventional charge pump configurations, however, in some embodiments, charge pump 100 further includes a discharge circuit, generally designated 110, that is connected to the plurality of charge-pump stages 105-1 through 105-n, wherein discharge circuit 110 is configured to selectively remove charge from primary circuit node 102. In some embodiments, discharge circuit 110 can include a plurality of discharge circuit elements 115-1 through 115-n that are each in communication with a respective one of charge-pump stages 105-1 through 105-n. In some embodiments, for example, discharge circuit elements 115-1 through 115-n can be a plurality of transistors arranged in a cascaded array between primary circuit node 102 and a reference 103 (e.g., a ground), with each of the plurality of transistors being connected to one of the plurality of charge pump stages 105-1 through 105-n. In some embodiments, discharge circuit elements 115-1 through 115-n can be provided as a field-effect transistor (FET) 'follower' that cascades the entire stack down to logic levels, with the gate of each FET being inserted between each of pump stages 105-1 through 105-n.

Such a configuration can be integrated with the design of charge-pump stages 105-1 through 105-n. For example, in some embodiments, the 'diodes' of charge-pump stages 105-1 through 105-n can be implemented using transistors, which can be operated in the typical way during charge pump ramp-up. When it is desired to draw down the charge at primary circuit node 102, however, the transistors can be operated on a transient basis to short out and remove the high voltage. In some embodiments, the feed to the transistor driver at the high-voltage end of the string can be made into a cascade with a low voltage trigger. In some embodiments, this configuration for discharge circuit 110 can be controlled by gating the lower FET.

Figure 2:
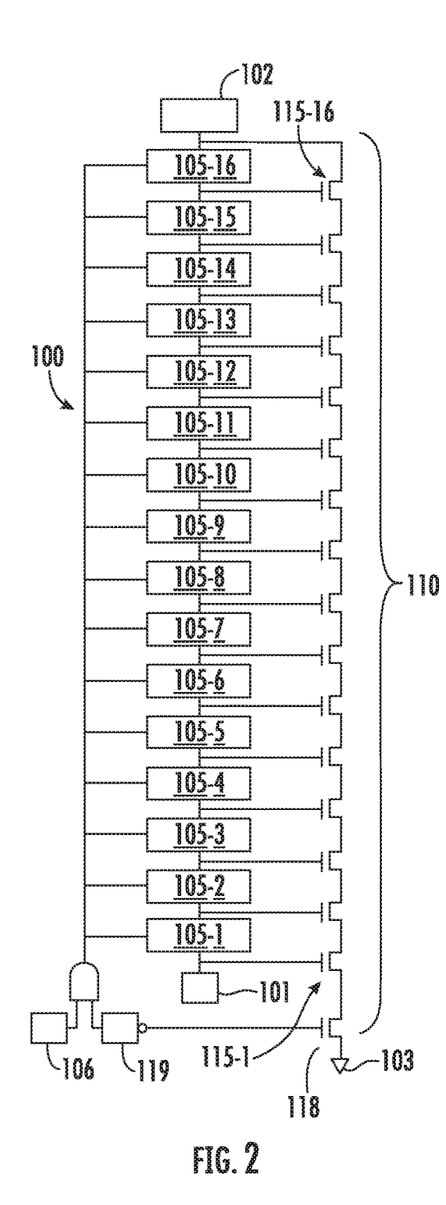
FIG. 2 is a schematic diagram of a charge pump according to an embodiment of the presently disclosed subject matter.

Referring to an example configuration illustrated in FIG. 2, charge pump 100 includes a stack of 16 charge-pump stages 105-1 through 105-16. Discharge circuit elements 115-1 through 115-16 are connected to each of associated charge-pump stages 105-1 through 105-16 in the form of transistors 116-1 through 116-16 (e.g., NFET followers), which are cascaded with the subsequent and previous pump stages. This circuit creates over-voltage situations when discharging primary circuit node 102 to reference 103.

To enable this discharge, a shorting switch 118 can be operated to trigger the removal of charge from primary circuit node 102. In some embodiments, such as in FIG. 2, shorting switch 118 is an additional transistor connected between the plurality of discharge circuit elements 115-1 through 115-16 and reference 103, although in other embodiments, the gate of transistor 116-1 (i.e., the one of the plurality of transistors 116-1 through 116-16 that is closest to reference 103) can be operable as shorting switch 118.

In some embodiments, actuation of shorting switch 118 can be achieved by the selective activation of an input voltage source 119 in communication with shorting switch 118. For example, where input voltage source 119 provides a potential of VIN=1, primary circuit node 102 is pumped to a high-voltage potential after several cycles of clock driver circuit 106. In this way, the voltage output at each subsequent pump stage increases in stepped increments until a desired charge is achieved at primary circuit node 102. Where input voltage source 119 is switched to provide a potential of VIN=0, discharge circuit 110 operates to cascade the high-voltage at primary circuit node 102 down to logic levels. In coordination with this pump down, clock driver circuit 106 can be gated off, and supply voltage node 101 can be floated or grounded. In this configuration, the gate of shorting switch 118 will remain charged when primary circuit node 102 is discharged.

Figure 3:
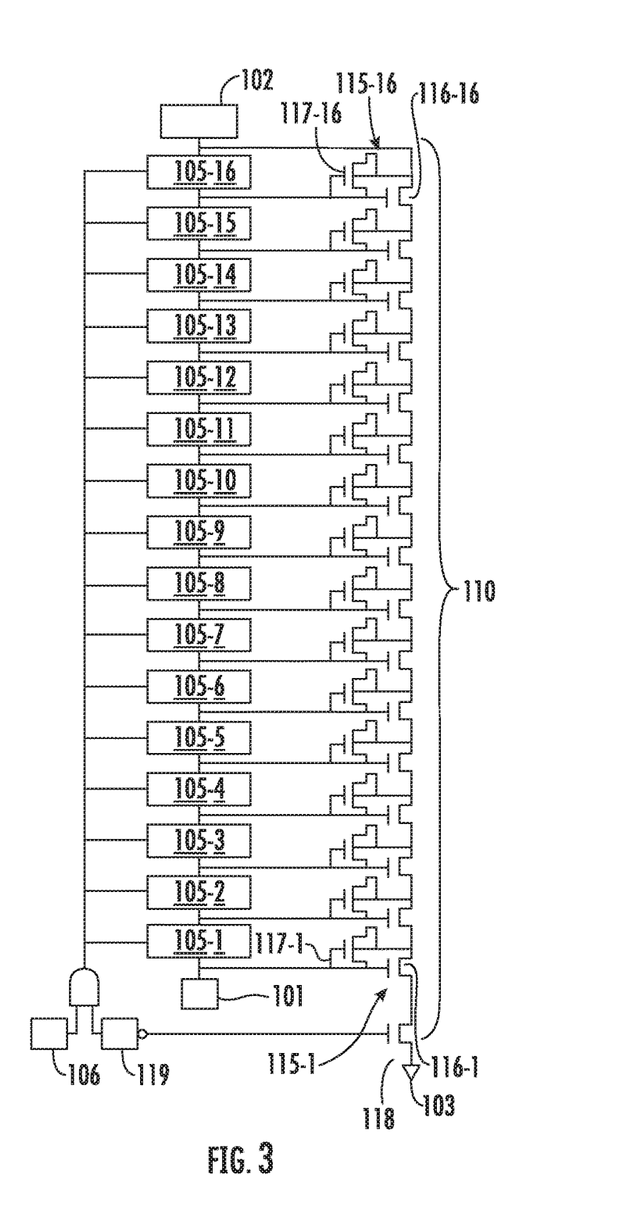
FIG. 3 is a schematic diagram of a charge pump according to an embodiment of the presently disclosed subject matter.
Figure 4:
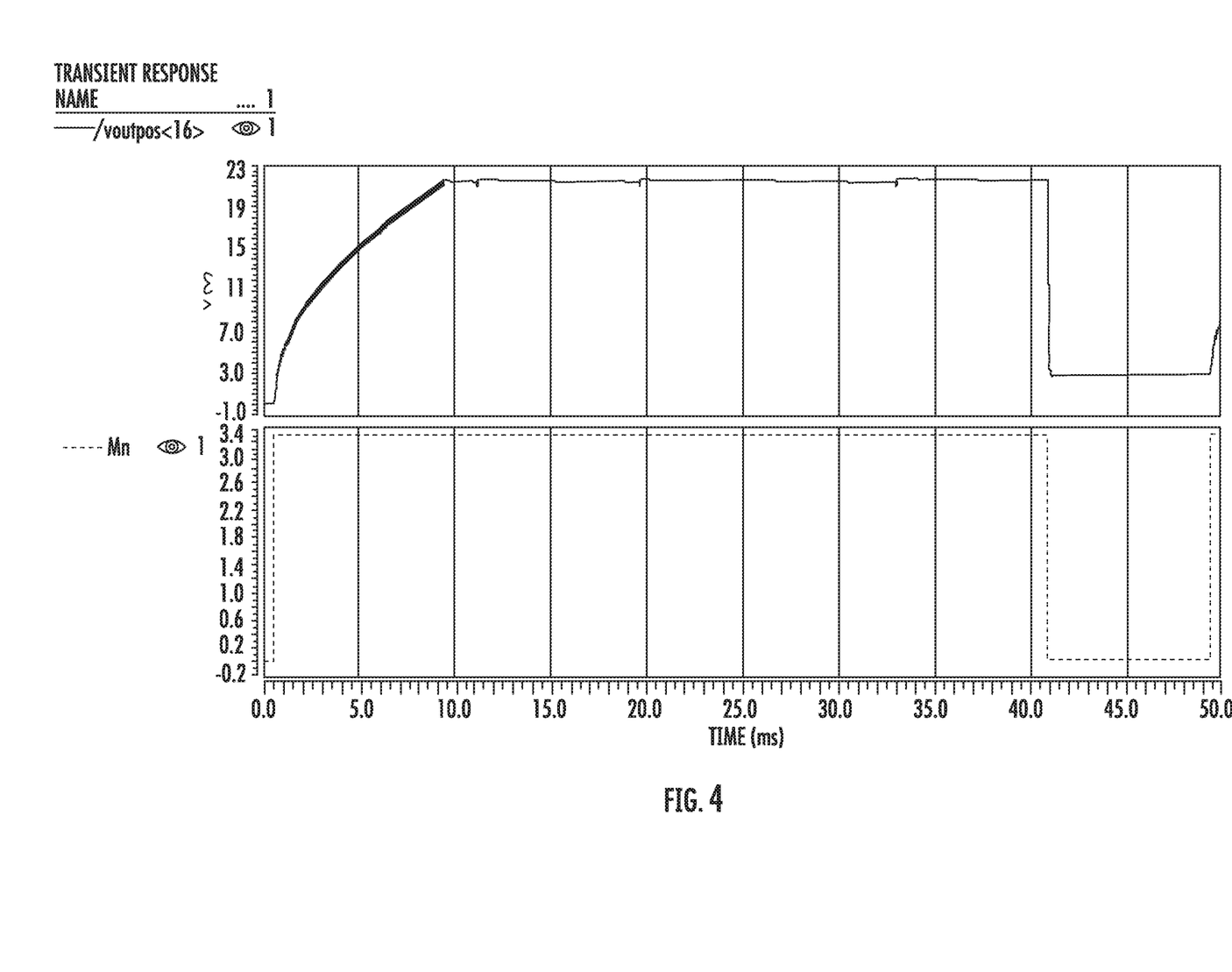
FIG. 4 is a graph illustrating voltage at a primary circuit node of a charge pump according to an embodiment of the presently disclosed subject matter.

In another example configuration shown in FIG. 3, discharge circuit elements 115-1 through 115-n can include a plurality of diodes 117-1 through 117-n connected from gate to drain at a respective one of the plurality of transistors 116-1 through 116-16 that are cascaded between primary circuit node 102 and reference 103. In some embodiments, diodes 117-1 through 117-n facilitate the removal of charge from primary circuit node 102 by discharging the gates of transistors 116-1 through 116-n of discharge circuit elements 115-1 through 115-n and the associated one of charge-pump stages 105-1 through 105-n when primary circuit node 102 is connected to reference 103. In this arrangement, diodes 117-1 through 117-n help the switches collapse safely (e.g., by preventing some of transistors 116-1 through 116-n from breaking down during the transient). Similar to the configuration discussed above with respect to FIG. 2, this circuit is designed to provide a logic translation to primary circuit node 102 when the potential at input voltage source 119 is '1' and a logic low level when the potential at input voltage source 119 is '0'. Such a result is shown in FIG. 4, where the potential at primary circuit node 102 (upper waveform) corresponds to the state at input voltage source 119 (lower waveform).

In some embodiments, since the systems and methods discussed above provide high-voltage control without the need for high-voltage switches, charge pump 100 and/or discharge circuit 110 according to the present disclosure can be implemented using manufacturing methods that may only have low-voltage transistors. In some embodiments, for example, silicon-on-insulator (SOI) or other similar processes (e.g., SiGe) may be used. In particular with respect to a SOI implementation, the operation of charge pump 100 and/or discharge circuit 110 can be more efficient due to lower parasitics to ground compared to other technologies. In addition, low-voltage implementations can minimize the parasitic capacitances with minimum size transistors and not having the body tied to a substrate, resulting in charge pump 100 and/or discharge circuit 110 being comparatively efficient and small with small value coupling capacitors, and control that is more complex can be enabled compared to simple diode-connected FETs. In addition, a large depletion region would not be required for substrate isolation.

Regardless of the particular configuration of charge pump 100, the present subject matter can provide advantages in a range of application. In some embodiments, for example, charge pump 100 as described herein can be used as a charge source for micro-electro-mechanical systems (MEMS) device. Referring to the arrangement illustrated in FIG. 5, a MEMS device, generally designated 120, includes at least one fixed electrode 122 (e.g., provided on a substrate 121), and a movable beam 123 is suspended over fixed electrode 122, movable beam 123 including at least one movable electrode 124 that is spaced apart from fixed electrode 122 and is movable with respect to fixed electrode 122. Charge pump 100 is connected to this structure, with primary circuit node 102 being connected to one of fixed electrode 122 or movable electrode 124, and the other of movable electrode 124 or fixed electrode 122 being connected to ground. In this configuration, the deflection of movable beam 123 can be driven directly by charge pump 100. Thus, whereas conventional MEMS actuators generally require high voltage transistors to apply and remove the high-voltage from the MEMS, in some embodiments of MEMS device 120, no high-voltage transistors are needed (e.g., for an SOI implementation). Furthermore, since charge pump 100 is charging the MEMS itself (i.e., rather than a separate hold capacitor), only a relatively low charge needs to be provided (e.g., only enough to achieve between about 50 fF and 1 pF of capacitance). As a result, charge pump 100 can be very small, which is further helpful to avoid large steps due to the small load.

Figure 5:
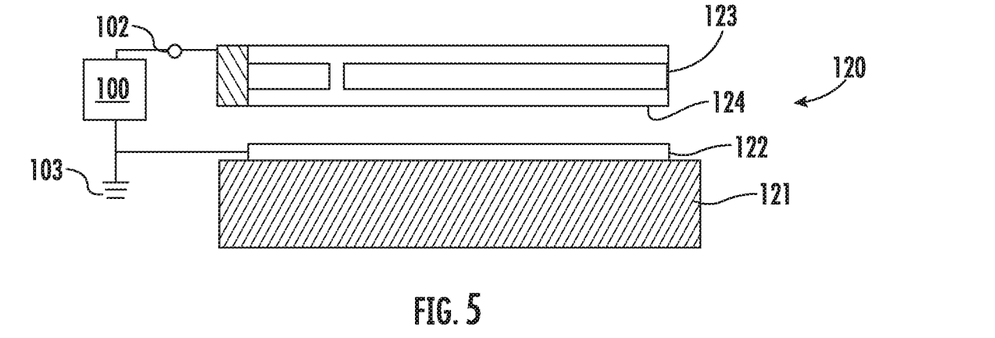
FIG. 5 is a side view of a micro-electro-mechanical device that is driven by a charge pump according to an embodiment of the presently disclosed subject matter.

Driving one or more such MEMS beams directly with charge pump 100 controls the deflection of movable beam 123 with charge rather than voltage. Thus, in contrast to conventional MEMS actuators, there will not be a pull-in but a progressive closure as charge is added and a progressive release as charge is removed. Although the time to charge may be greater in some embodiments as a result, such progressive closure can minimize ringing, which can result in a shorter total time to stable closure (e.g., compared to total time for snap-down plus time for ringing to subside). In addition, impact forces will be greatly reduced, avoiding fracturing and leading to far lower wear.

Figure 6:
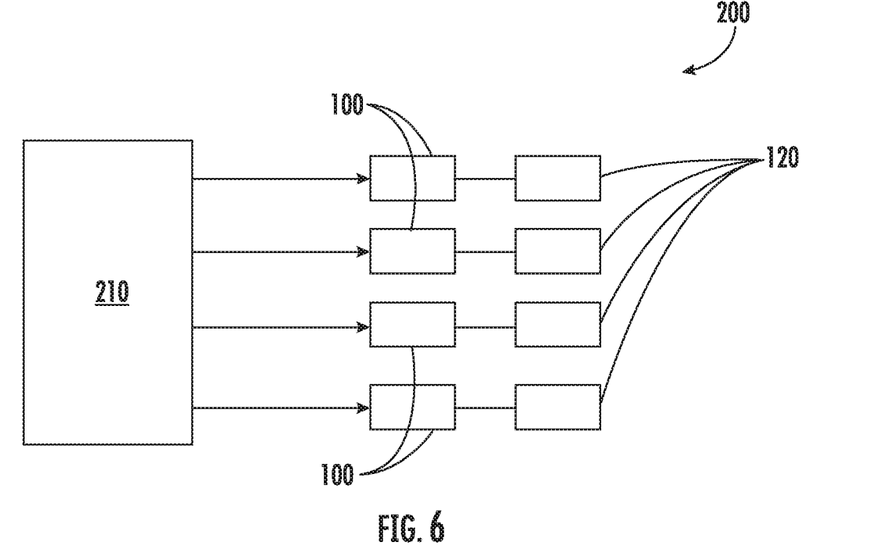
FIG. 6 is a schematic representation of a charge pump control system according to an embodiment of the presently disclosed subject matter.

Furthermore, in another aspect of the present subject matter, an array including multiple such MEMS devices 120 can each be driven by a corresponding charge pump 100. As illustrated in FIG. 6, for example, in some embodiments, an array, generally designated 200, can include a plurality of charge pumps 100 that are each associated with an individual MEMS device 120. A controller 210 or other input device in communication with each of charge pumps 100 provides an input digital control word that corresponds to the desired pattern of actuation of the MEMS devices 120 (e.g., corresponding to a desired total array behavior). In this arrangement, instead of having a single charge pump and an array of high-voltage level shifters driven by low-voltage digital words to control the array of devices, the bits from the low-voltage digital words can be used to actuate individual MEMS devices 120 by energizing selected respective individual charge pumps 100.

In any configuration or application, the operation of charge pump 100 can include any of a variety of control and regulation systems. In some embodiments, a regulation system for charge pump 100 is provided in order to sense the available high voltage output at primary circuit node 102 to determine when charge pump 100 should be activated. The regulation system for the charge pump can be configured to determine the number of cycles that the charge pump is clocked as well as a voltage increment required at each stage of the charge pump. The number of cycles that the charge pump is clocked is determined by one or more of the design of the charge pump, load capacitance, or the voltage increment required at each stage of the charge pump to achieve the desired high voltage output.

In some embodiments, the threshold level for starting the clock and the number of clock cycles are set to enable stability in control of the charge pump. In that case, the regulation system can be combined with a fractional drive to throttle the charge pump as well as manage any voltage spikes. This would require more cycles for a given voltage rise, but give finer control of the charge pump stages. Additionally, it may take longer for the string to stabilize after the clock cycles stop and the initial states of the charge pump may be uneven along the string.

The voltage increment can be determined from a measurement comparison to a desired threshold voltage or reference voltage. Additionally, the number of cycles needed to achieve the desired high voltage output can be computed based on the difference between the measured and reference voltages. Alternatively, the measurement of a voltage at or below the threshold voltage can act as a trigger for a fixed number of operating cycles to be initiated. In some embodiments, the measurement taken to make the comparison can be taken on the charge pump diode string itself when the charge pump is not active. In this way, a separate voltage divider is not necessary, which can be advantageous since the use of a voltage divider would add a comparatively large amount of leakage to the charge pump, requiring the charge pump to be operated more often to maintain the desired high voltage output at the primary circuit node.

Referring to one configuration for a regulation system, FIG. 6 illustrates a regulation system 150 that is configured to take a voltage measurement for charge pump 100. In the illustrated configuration, this measurement can be taken near the bottom of the string of charge pump stages 105-1 through 105-$n$, which provides regulation system 150 with a low voltage that is in direct proportion to the high voltage at the top of the string. Alternatively, regulation system 150 can be provided in communication with one of discharge circuit elements 115-1 through 115-$n$ or with shorting switch 118.

Figure 7:
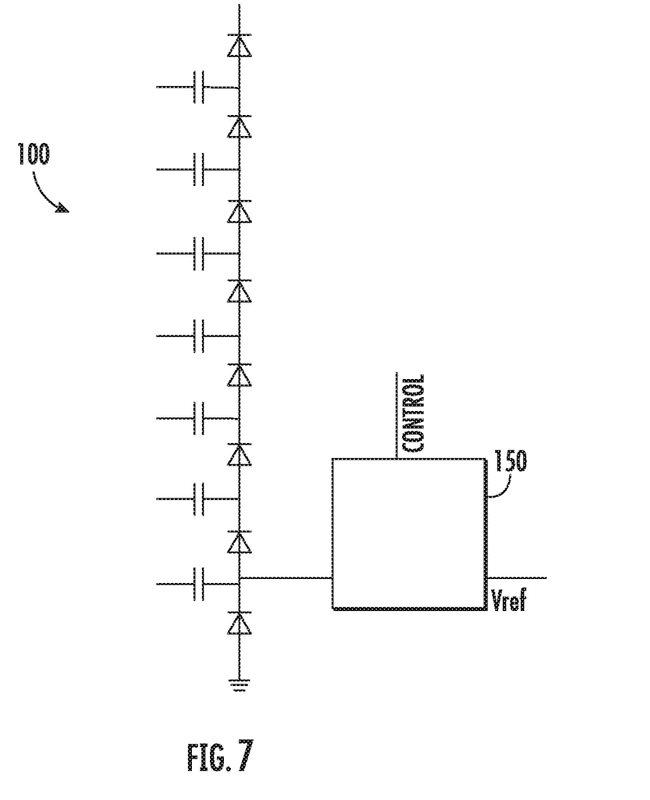
FIG. 7 is a schematic representation of a charge pump control system according to an embodiment of the presently disclosed subject matter.

In any configuration, regulation system 150 can be configured to extrapolate the present voltage at primary circuit node 102 from the voltage measurement taken at the bottom of the string, such as is illustrated in FIG. 7. In particular, in embodiments in which charge pump 100 is implemented using SOI processes or other insulated substrate transistor technologies, the voltage division can be more uniform among charge pump stages 105-1 through 150-$n$ than in other implementations (e.g., CMOS), and thus the measurement taken by regulation system 150 can be used to determine the voltage at primary circuit node 102. The system extrapolates the present voltage by finding the difference between the reference voltage and the measured voltage corresponding to the desired high voltage output at primary circuit node 102. Regulation system 150 then uses this information to calculate the number of clock cycles that charge pump 100 needs to be activated in order to achieve the desired voltage level at primary circuit node 102

In some embodiments, such a measurement on the diode string can be obtained by a high impedance input to avoid disturbing the voltage division. By avoiding the separate measurement divider, current consumption should be greatly reduced. Furthermore, a direct measurement on the charge pump will provide nearly instantaneous voltage measurement and therefore allow for tighter, more precise regulation of the charge pump, as well as a lower ripple during a static "on" state. By not requiring a separate divider string, it will greatly decrease the leakage from the primary circuit node, leading to lower DC current consumption and lower average noise.

The present subject matter can be embodied in other forms without departure from the spirit and essential characteristics thereof. The embodiments described therefore are to be considered in all respects as illustrative and not restrictive. Although the present subject matter has been described in terms of certain preferred embodiments, other embodiments that are apparent to those of ordinary skill in the art are also within the scope of the present subject matter.

The invention claimed is:

1. A micro-electro-mechanical systems (MEMS) array comprising:
a plurality of charge pumps, each of the plurality of charge pumps comprising a plurality of series-connected charge-pump stages connected between a supply voltage node and a primary circuit node;
a plurality of MEMS devices, each of the plurality of MEMS devices connected to one of the plurality of charge pumps and comprising:
at least one fixed electrode; and
a movable beam including at least one movable electrode that is spaced apart from the at least one fixed electrode and is movable with respect to the at least one fixed electrode;
wherein the primary circuit node of the one of the plurality of charge pumps is connected to one of the at least one movable electrode or the at least one fixed electrode; and
a controller in communication with each of the plurality of charge pumps, wherein the controller is configured to control the plurality of charge pumps to drive a corresponding combination of the plurality of MEMS devices that corresponds to a desired total array behavior of the plurality of MEMS devices.

2. The micro-electro-mechanical systems (MEMS) array of claim 1, wherein each of the charge-pump stages comprises a silicon-on-insulator (SOI) device.

3. The micro-electro-mechanical systems (MEMS) array of claim 1, wherein each of the plurality of charge pumps comprises a discharge circuit connected to the plurality of charge-pump stages, wherein the discharge circuit is configured to selectively remove charge from the primary circuit node.

4. The micro-electro-mechanical systems (MEMS) array of claim 3, wherein the discharge circuit comprises a plurality of transistors arranged in a cascaded array between the primary circuit node and a reference, wherein each of the plurality of transistors is connected to one of the plurality of charge pump stages.

5. The micro-electro-mechanical systems (MEMS) array of claim 4, wherein the discharge circuit comprises a diode connected between a gate and a drain of each of the plurality of transistors.

6. The micro-electro-mechanical systems (MEMS) array of claim 1, comprising a voltage measurement device configured to measure a present charge state at the primary circuit node;
wherein the voltage measurement device is connected in communication with one of the plurality of charge-pump stages, and
wherein the voltage measurement device is configured to extrapolate the present charge state at the primary circuit node from a voltage measurement taken at the one of the plurality of charge-pump stages.

7. A method for operating a micro-electro-mechanical systems (MEMS) array comprising a plurality of MEMS devices, each of the plurality of MEMS devices comprising at least one fixed electrode and a movable beam including at least one movable electrode that is spaced apart from the at least one fixed electrode and is movable with respect to the at least one fixed electrode, the method comprising:
connecting a plurality of charge pumps to the plurality of MEMS devices, each of the plurality of charge pumps comprising a supply voltage node, a primary circuit node, and a plurality of series-connected charge-pump stages connected between the supply voltage node and the primary circuit node, wherein the primary circuit node of each of the plurality of charge pumps is connected to one of the at least one movable electrode or the at least one fixed electrode of one of the plurality of MEMS devices; and
selectively operating the plurality of charge pumps to drive a corresponding combination of the plurality of MEMS devices that corresponds to a desired total array behavior of the plurality of MEMS devices.

8. The method of claim 7, wherein selectively operating the plurality of charge pumps comprises driving charge between the series-connected charge-pump stages in response to a control input from a clock driver circuit.

9. The method of claim 7, further comprising selectively removing charge from the primary circuit node through a discharge circuit connected to the plurality of charge-pump stages.

10. The method of claim 9, wherein selectively removing charge comprises controlling a diode connected between a gate and a drain of each of the plurality of transistors.

11. The method of claim 7, further comprising measuring a present charge state at the primary circuit node by extrapolating the present charge state from a voltage measurement taken at one of the plurality of charge-pump stages.

12. The method of claim 11, wherein selectively operating the plurality of charge pumps comprises driving charge between the stages of the plurality of series-connected charge-pump stages if the present charge state is less than a desired charge state.

* * * * *